United States Patent [19]

Larowe

[11] Patent Number: 4,568,999
[45] Date of Patent: Feb. 4, 1986

[54] MULTILAYER CERAMIC CAPACITOR ON PRINTED CIRCUIT

[75] Inventor: Robert D. Larowe, Tucson, Ariz.

[73] Assignee: The United States of America as represented by the Secretary of the Air Force, Washington, D.C.

[21] Appl. No.: 617,666

[22] Filed: Jun. 6, 1984

[51] Int. Cl.[4] .......................... H01G 1/14; H01R 9/00
[52] U.S. Cl. .................................... 361/306; 361/408
[58] Field of Search .............. 361/306, 308, 309, 310, 361/321, 400, 402, 408, 307, 433 C

[56] References Cited

U.S. PATENT DOCUMENTS

| | | | |
|---|---|---|---|
| 2,850,681 | 9/1958 | Horton | 361/306 X |
| 3,236,936 | 2/1966 | Robinson | 361/308 X |
| 3,437,736 | 4/1969 | Asher et al. | 361/308 X |
| 3,444,436 | 5/1969 | Coda | 361/306 X |
| 3,515,958 | 6/1970 | Claypoole et al. | 361/310 |
| 3,524,108 | 8/1970 | English | 361/408 X |
| 3,612,963 | 10/1971 | Piper et al. | 361/309 X |
| 3,818,279 | 6/1974 | Seeger et al. | 361/408 X |
| 4,047,240 | 9/1977 | Insetta | 361/275 |
| 4,101,952 | 7/1978 | Burn | 361/305 |
| 4,114,120 | 9/1978 | Lupfer | 361/306 X |
| 4,297,773 | 11/1981 | Galvagni | 29/25.42 |
| 4,385,342 | 5/1983 | Puppolo et al. | 361/433 |
| 4,413,308 | 11/1983 | Brown | 361/408 X |
| 4,451,869 | 5/1984 | Sakabe et al. | 361/309 |
| 4,509,103 | 4/1985 | Prymak | 361/321 |

FOREIGN PATENT DOCUMENTS

| | | | |
|---|---|---|---|
| 618224 | 2/1961 | Italy | 361/307 |
| 734824 | 5/1980 | U.S.S.R. | 361/321 |

*Primary Examiner*—Donald A. Griffin
*Attorney, Agent, or Firm*—Donald J. Singer; Bernard E. Franz

[57] ABSTRACT

The multilayer capacitor has the plates arranged vertically, which allows planar attachment with conductive epoxy to a substrate such as a thick film conductor on alumina. The top termination may use wire bonding. The capacitor has the same form factor and size as prior capacitors of the same electrical ratings.

2 Claims, 7 Drawing Figures

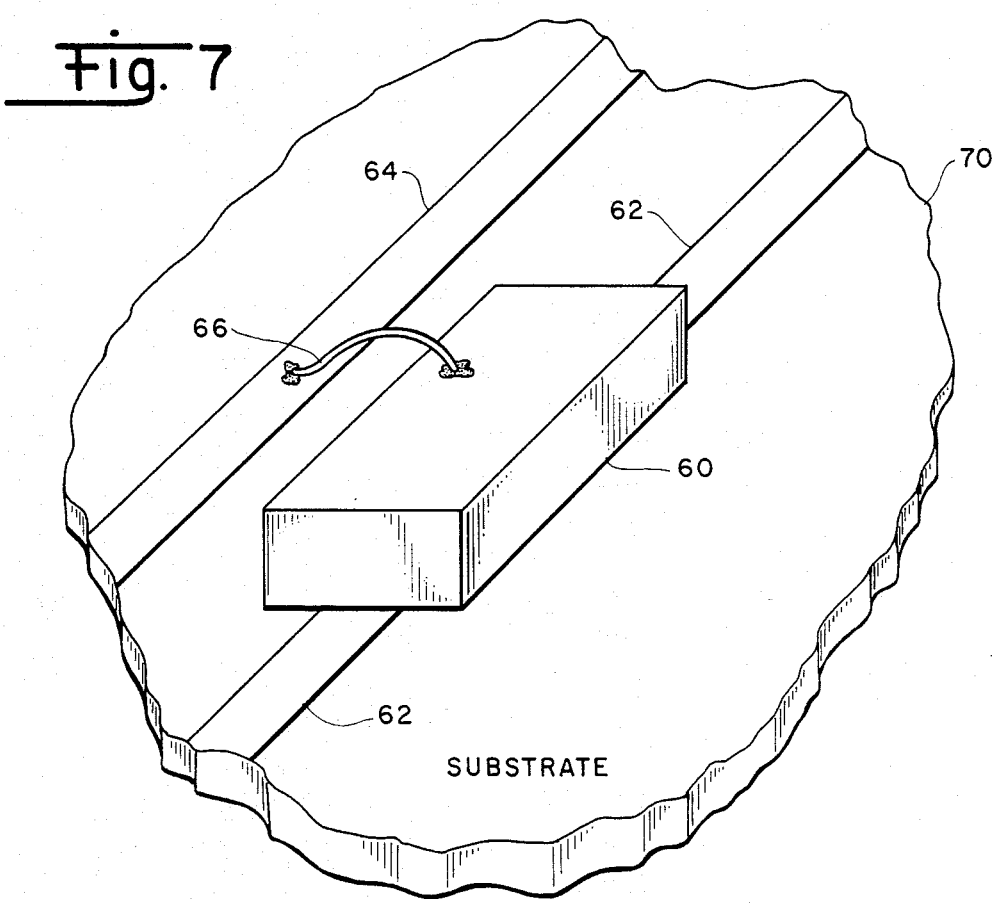

MULTILAYER CERAMIC CAPACITOR ON PRINTED CIRCUIT

RIGHTS OF THE GOVERNMENT

The invention described herein may be manufactured and used by or for the Government of the United States for all governmental purposes without the payment of any royalty.

BACKGROUND OF THE INVENTION

This invention relates to multilayer ceramic capacitors, and more particularly to chip capacitors adapted to be connected directly to circuit boards.

Current electronic devices, including hybrid circuits on printed circuit boards, are making progressively increasing use of chip capacitors because of their compactness and inherent reliability.

In accordance with a conventional means for employing such capacitors, the same are provided with two or more termination portions at their edges and are mounted directly to a substrate of alumina or epoxy-filled fiberglass carrying conductive lands on the surface thereof. Solder or conductive epoxy connections are effected between the capacitors and the lands, the terminations being in direct contact with the lands. The solder or epoxy provides both electrical and mechanical connections of the article to the substrate.

Due to the differential coefficients of expansion of the various connected materials and due further to the relative fragility of the capacitors, particularly at the interface between the termination and the capacitor electrodes, a relatively high incidence of capacitor failure has been experienced despite the inherent reliability of the capacitor device.

In some applications, present methods of construction demand an attachment method that is prone to shorting, and attachment can cause one conductive epoxy joint to break due to the difference in thermal coefficient of expansion between alumina and barium titanate. This is a critical technical problem in manufacturing.

In addition, many hybrids utilize a large number of capacitors and much substrate area is lost. It would be desirable to make more efficient use of the substrate area.

SUMMARY OF THE INVENTION

An object of the invention is to provide a ceramic chip capacitor which permits more reliable manufacturing of printed circuits.

The multilayer capacitor according to the invention has the plates arranged vertically, which allows planar attachment to the substrate. The top termination may use wire bonding. The capacitor has the same form factor and size as prior capacitors of the same electrical ratings.

Other advantages include a higher capacitance per unit area of substrate, lower inductance leads possible (shorter), and a simpler attachment to a printed circuit.

BRIEF DESCRIPTION OF THE DRAWING

FIG. 7 is an isometric view of a capacitor on a portion of a printed circuit.

DETAILED DESCRIPTION

Figure 1:
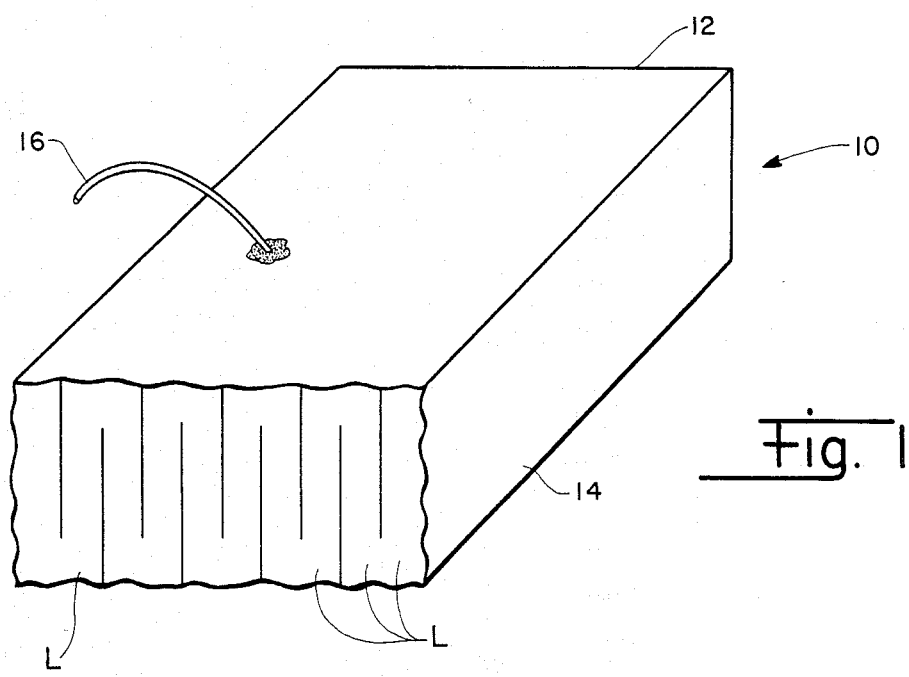
FIG. 1 is an isometric view of a capacitor, with one end cut away to show the interior construction.
Figure 2:
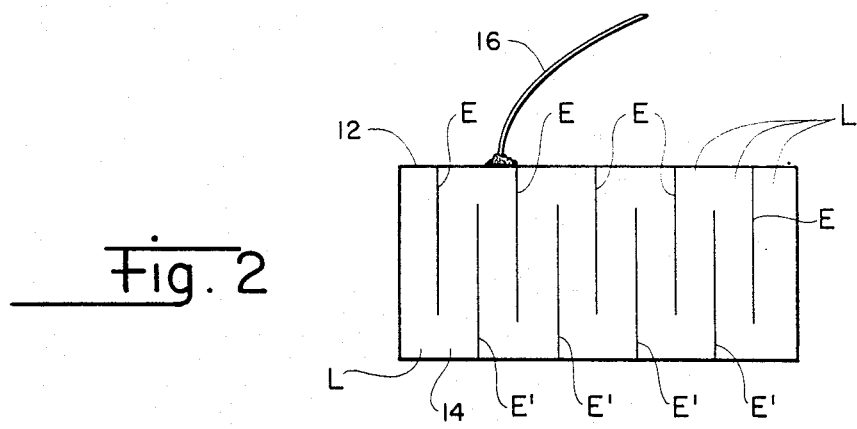
FIG. 2 is a cross-section view.

A capacitor according to the invention is shown in FIG. 1 in an isometric view, with one end cut away to show the interior construction. FIG. 2 is a cross-section view.

As is conventional, the capacitor is comprised of a series of ceramic layers L defining the dielectric components of the capacitor and the encapsulation thereof. The ceramic may for example be barium titanate. Between the layers L there are formed the electrodes E, E' by screening of metal onto an associated ceramic layer. The new feature is that the plates are arranged vertically. The electrodes of one polarity, e.g. the electrodes E, run from the top surface 12 vertically, terminating at a position short of the bottom surface 14 of the capacitor. In similar fashion, the electrodes E' of opposite polarity begin at a position coextensive with the bottom surface 14 and terminate short of the top surface 12.

As will be understood by those skilled in the art, the ceramic member comprising the layers L with electrodes E and E' will be fired, following which metallization is applied to the top and bottom surfaces, providing means for connecting electrodes of opposite polarity into the circuit. There is no metallization on the four vertical sides. A wire 16 is bonded to the top surface 12. The wire bondable area can be kept small to reduce cost, i.e. a small wire-bondable spot is provided on top of inexpensive metallization of the entire surface. The entire bottom surface 14 is metallized, for attachment with conductive epoxy to a substrate. This surface should be reasonably flat for surface mounting.

Typical dimensions for such a capacitor are 50 mils thick between the top and bottom surfaces, 100 mils wide, and 150 mils long which would have a value in the range of 20 to 50 thousand picofarads. For other proposed sizes, the thickness may range from 40 to 85 mils, and the other dimensions from 40 to 225 mils.

Figure 3:
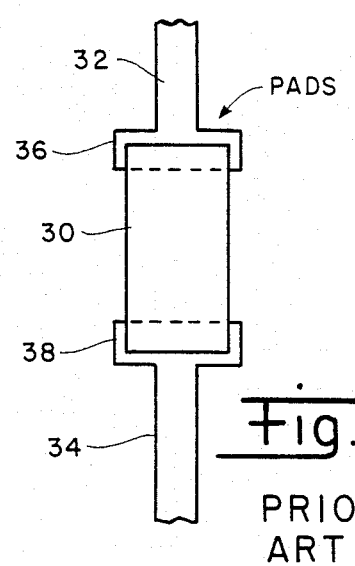
FIGS. 3 and 4 are layout views of a portion of a printed circuit showing the mounting of prior-art capacitors.
Figure 4:
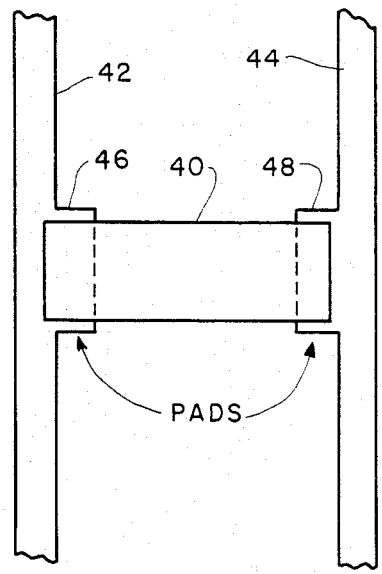

The prior-art capacitors required conductive lands or pads on printed-circuit cards for attachment, such as pads 36, 38 in FIG. 3, or pads 46, 48 in FIG. 4. In FIG. 3, a capacitor 30 is shown connected via pads 36 and 38 to the conductors 32 and 34; and similarly in FIG. 4, the capacitor 40 is connected via pads 46 and 48 to conductors 42 and 44. The capacitors could be attached to the pads with conductive epoxy; or as shown in U.S. Pat. No. 4,297,773 to Galvagni, the capacitors might be soldered to the conductive lands. The type of attachment locks the capacitor against substantial movement relative to the substrate, and therefore sometimes causes one joint to break due to the differences in thermal expansion between the capacitor ceramic and the substrate, for example, between alumina and barium titanate. The method of attachment is also prone to shorting. The design layout is complicated by the requirement for providing special pads.

Figure 5:
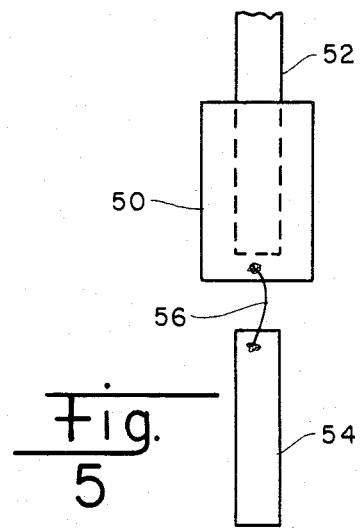
FIGS. 5 and 6 are layout views showing typical layouts for mounting and connecting a capacitor according to the invention on a printed circuit.
Figure 6:
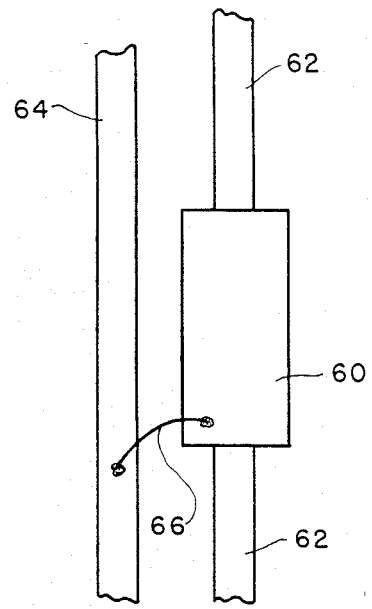

FIGS. 5 and 6 show how the new capacitor can be attached in a circuit which has thick film conductors of a ceramic substrate such as alumina. The capacitors 50 and 60 are of the type shown in FIGS. 1 and 2. The capacitor 50 has it bottom surface attached directly to a conductor 52 with conductive epoxy, and the wire 56 bonded to the top surface is soldered or wire bonded directly to a conductor 54; and similarly the capacitor 60 has its bottom surface attached by conductive epoxy to a conductor 62, and the wire 66 soldered or wire bonded to a conductor 64. Note that in FIGS. 3-6 the substrate of the printed circuit is not shown to simplify the drawing. FIG. 7 is an isometric view corresponding to FIG. 6, showing the substrate 70 cut-away to show the substrate area only for the capacitor 60 and portions of the two conductors 62 and 64 to which it is attached. It can be seen in FIG. 7 that other components might be mounted on top of the capacitor to make better use of the substrate area.

It is understood that certain modifications to the invention as described may be made, as might occur to one with skill in the field of this invention, within the scope of the appended claims. Therefore, all embodiments contemplated hereunder which achieve the objects of the present invention have not been shown in complete detail. Other embodiments may be developed without departing from the spirit of the invention or from the scope of the appended claims.

I claim:

1. A printed circuit comprising a substrate with conductors thereon, an improved chip capacitor having a ceramic body, said substrate and said ceramic body having substantially different coefficients of expansion, a plurality of electrodes of one polarity partially overlapping a plurality of electrodes of opposite polarity, said ceramic body forming a dielectric separator for said electrodes, the electrodes being arranged vertically perpendicular to a bottom and a top surface of the capacitor, with the electrodes of one polarity extending to the bottom surface—but not to the top surface, and the electrodes of the opposite polarity extending to the top surface but not to the bottom surface, the bottom surface being completely metallized to interconnect all of the electrodes which extend thereto, and the top surface being completely metallized to interconnect all of the electrodes which extend thereto, a wire-bondable area being provided on top of the metallization of the top surface, surfaces of the capacitor other than the top and bottom are not metallized, the bottom surface being attached directly to a thick film conductor of the printed circuit board with conductive epoxy, so that all of the electrodes are perpendicular to a surface of said substrate, with no pads being provided on the printed circuit board for mounting of the capacitor, the width of the thick film conductor being independent of the dimensions of the capacitor, and the top surface having conductive means comprising a wire bonded to said wire-bondable area and connected to another conductor of the printed circuit.

2. The invention according to claim 1, wherein said substrate is alumina, and said ceramic body is barium titanate.

* * * * *